(12) United States Patent
Chang et al.

(10) Patent No.: US 11,513,568 B2
(45) Date of Patent: Nov. 29, 2022

(54) INFORMATION HANDLING SYSTEM ANTENNA ISOLATION WITH INTEGRATED COOLING FAN

(71) Applicant: Dell Products L.P., Round Rock, TX (US)

(72) Inventors: Ching Wei Chang, Cedar Park, TX (US); Suresh Ramasamy, Cedar Park, TX (US); Allen B. McKittrick, Cedar Park, TX (US); Jeffery D. Kane, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 50 days.

(21) Appl. No.: 17/090,406

(22) Filed: Nov. 5, 2020

(65) Prior Publication Data

US 2021/0055767 A1  Feb. 25, 2021

Related U.S. Application Data

(62) Division of application No. 16/220,653, filed on Dec. 14, 2018, now Pat. No. 10,852,782.

(51) Int. Cl.
| | | |
|---|---|---|
| *G06F 1/16* | (2006.01) |
| *G06F 1/20* | (2006.01) |
| *H05K 7/20* | (2006.01) |
| *H05K 5/02* | (2006.01) |
| *H05K 5/03* | (2006.01) |

(52) U.S. Cl.
CPC .......... *G06F 1/1698* (2013.01); *G06F 1/1662* (2013.01); *G06F 1/1681* (2013.01); *G06F 1/203* (2013.01); *H05K 5/0226* (2013.01); *H05K 5/03* (2013.01); *H05K 7/20163* (2013.01)

(58) Field of Classification Search
CPC .... G06F 1/1698; G06F 1/1662; G06F 1/1681; G06F 1/203; H05K 5/0226; H05K 5/0239; H05K 5/03; H05K 7/20163
USPC ........................................................ 361/688
See application file for complete search history.

(56) References Cited

U.S. PATENT DOCUMENTS

| | | |
|---|---|---|
| 5,704,212 A | 1/1998 | Erler |
| 6,380,930 B1 | 4/2002 | Van Ruymbeke |
| 6,414,643 B2 * | 7/2002 | Cheng ................... G06F 1/1616 343/702 |
| 6,532,152 B1 | 3/2003 | White |
| (Continued) |

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.

(Continued)

*Primary Examiner* — Anatoly Vortman
(74) *Attorney, Agent, or Firm* — Zagorin Cave LLP; Robert W. Holland

(57) ABSTRACT

A portable information handling system structure located between housing hinges along one side of the housing has first and second antenna disposed at opposing ends with a cooling fan between the first and second antenna and over the antenna structure to isolate the first and second antenna. In one embodiment, a parasitic element disposed between the first and second antenna and under the cooling fan has resonance tuned to isolate wireless signals of a frequency supported by the first and second antenna.

7 Claims, 9 Drawing Sheets

(56) References Cited

U.S. PATENT DOCUMENTS

| | | | |
|---|---|---|---|
| 6,765,536 B2 | 7/2004 | Phillips et al. | |
| 6,959,209 B2 | 10/2005 | Fang | |
| 7,764,493 B2* | 7/2010 | Ali | H01L 23/4093 |
| | | | 361/679.48 |
| 9,203,137 B1* | 12/2015 | Guterman | H01Q 1/243 |
| 10,074,887 B2 | 9/2018 | Nivet | |
| 10,148,304 B2 | 12/2018 | Chang | |
| 10,268,236 B2* | 4/2019 | Guterman | G06F 1/1681 |
| 10,367,263 B2* | 7/2019 | Files | H04M 1/0243 |
| 2001/0040529 A1 | 11/2001 | Cheng | |
| 2008/0062065 A1 | 3/2008 | Yamamoto et al. | |
| 2009/0091505 A1 | 4/2009 | Tsai | |
| 2009/0175003 A1 | 7/2009 | Ali | |
| 2010/0073895 A1 | 3/2010 | Yoshida | |
| 2010/0112833 A1 | 5/2010 | Jeon | |
| 2012/0099261 A1 | 4/2012 | Reber | |
| 2012/0249379 A1 | 10/2012 | Matsushita | |
| 2013/0057785 A1 | 3/2013 | Hiratomo | |
| 2013/0083254 A1 | 4/2013 | Murakami | |
| 2014/0111926 A1 | 4/2014 | Reid et al. | |
| 2014/0168893 A1 | 6/2014 | Chia-Ching et al. | |
| 2014/0242903 A1 | 8/2014 | DeLuis et al. | |
| 2016/0248893 A1 | 8/2016 | Junhong | |
| 2017/0212554 A1* | 7/2017 | Guterman | G06F 1/1681 |
| 2017/0244163 A1 | 8/2017 | Yoo et al. | |
| 2018/0006354 A1 | 1/2018 | Nivet et al. | |
| 2019/0081385 A1* | 3/2019 | Avser | H01Q 5/328 |
| 2019/0237865 A1* | 8/2019 | Ramasamy | H01Q 1/2266 |
| 2019/0356051 A1* | 11/2019 | Barrera | H01Q 1/44 |

OTHER PUBLICATIONS

Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

* cited by examiner

INFORMATION HANDLING SYSTEM ANTENNA ISOLATION WITH INTEGRATED COOLING FAN

CROSS-REFERENCE TO RELATED APPLICATIONS

This application is a divisional of U.S. patent application Ser. No. 16/220,653, filed Dec. 14, 2018, entitled "Information Handling System Antenna Isolation with Integrated Cooling Fan," naming Ching Wei Chang, Suresh Ramasamy, Allen B. McKittrick, and Jeffery D. Kane as inventors, which application is incorporated herein by reference in its entirety.

BACKGROUND OF THE INVENTION

Field of the Invention

The present invention relates in general to the field of information handling system wireless communication, and more particularly to an information handling system antenna isolation with an integrated cooling fan.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally support mobile operations with processing components, input/output (I/O) devices and a power source integrated in a portable housing so that an end user may interact with the system free from external cable interfaces. For instance, tablet information handling systems integrate processing components and a battery in a planar housing covered by a touchscreen display that presents information as visual images and accepts touches as inputs. Convertible information handling systems generally distribute the processing components, battery and display between two separate rotationally coupled housing portions with one housing portion integrating the display and the other covered by a keyboard. A typical convertible information handling system rotates the housing portions from a closed position that protects the display by rotating it next to the keyboard to a clamshell position that holds the display vertically above the keyboard so an end user can type inputs at the keyboard while viewing the display. Some convertible information handling systems rotate the housing portions 360 degrees from the closed position to expose the display for use as a tablet.

Generally portable information handling system length and width dimensions are driven by the size of the display integrated in the housing. Often, end user's select information handling systems for a display viewing area and then weigh desired processing capabilities against system height and weight. Generally, more powerful processing components tend to have greater height and weight so that the processing components have adequate power and thermal operating constraints. As system height decreases, thermal constraints in particular become difficult to manage as the internal housing cavity tends to have less efficient cooling airflow. Some very thin systems maintain thermal constraints by relying on passive thermal transfer instead of including a cooling fan, however, active thermal management with a cooling fan generally offers a substantial increase in thermal management of more powerful processing components. Generally, information handling system manufacturers attempt to dispose processing components and active cooling resources in a portable housing in an efficient manner that allows for low Z-height.

One way to reduce portable housing length and width dimensions is to integrate the display in the housing with a narrow border along the perimeter of the display. Generally, to reduce the display border a variety of components typically included with the display housing portion are moved instead to the main housing portion. For instance, display housing portions often include a camera, microphone and wireless antenna that are instead moved to the main housing portion. Moving such components to the main housing portion tends to crowd areas of the main housing portion where the components are most convenient, such as along the base of the display. Wireless antenna placement presents a particular difficulty as the antenna radiation pattern faces increased interference and lower height in the main housing portion, which impedes wireless signal transfer. Further, to ensure adequate housing strength in the face of torsional forces introduced by rotation around hinges, metallic housing material is typically used, which further impacts wireless signal transfer. Although non-metallic windows may be included in the housing, these areas create weakness, such as in the case of a physical impact at the non-metallic window. In many cases, multiple antenna are included that communicate in shared frequency ranges, which will create isolation issues, especially within an all metal enclosure.

SUMMARY OF THE INVENTION

Therefore, a need has arisen for a system and method which isolates radiofrequency elements located in close proximity in an information handling system portable housing.

In accordance with the present invention, a system and method are provided which substantially reduce the disadvantages and problems associated with previous methods and systems for integrating antenna in an information handling system portable housing. An antenna structure disposed along one side of a housing supports plural antenna separated by a cooling fan disposed over the antenna structure to enhance isolation. In one embodiment, a tunable parasitic element disposed under the cooling fan exhaust further isolates the antenna.

More specifically, a portable information handling system processes information with processing components disposed in a housing having rotationally coupled main and lid portions. A display integrated in the lid portion presents information as visual images with a narrow edge so that antenna to support wireless communication are integrated in the main housing portion. An antenna support disposed along a rear side of the main housing portion supports first and second antenna at opposing ends, such as LTE antenna to support wireless wide area network (WWAN) communication. Isolation between the antennas is provided by a grounded metal housing of a cooling that exhausts between the antennas over the antenna support. In one embodiment, the cooling fan assembles in an opening formed in a motherboard and couples to a heat pipe that transfers heat from a central processing unit (CPU) coupled to the motherboard. A tunable parasitic element disposed on the antenna support between the antenna and under cooling fan adapts isolation to plural frequency bands based upon the isolation response of the cooling fan and heat pipe for each frequency band.

The present invention provides a number of important technical advantages. One example of an important technical advantage is that a cooling fan assembles at an information handling system motherboard between wireless antenna to isolate the antenna, thus reducing mutual coupling and improving radiofrequency efficiency. Grounded metal structures of the cooling fan and heat transfer structure absorbs radiofrequency energy transferred between the antenna to allow placement of the antenna in close proximity within an information handling system housing with less impact upon desired radiofrequency transmissions. Leveraging metallic structure of a cooling fan to provide antenna isolation reduces the need to add other structures dedicated to antenna isolation. In one embodiment, a parasitic element is added to further reduce mutual coupling and tuned to adapt the parasitic response to changing frequencies of the antenna.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system assembles a cooling fan to extend over an antenna structure disposed along one side of a housing so that a grounded conductive surface of the cooling fan isolates the antenna from each other. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
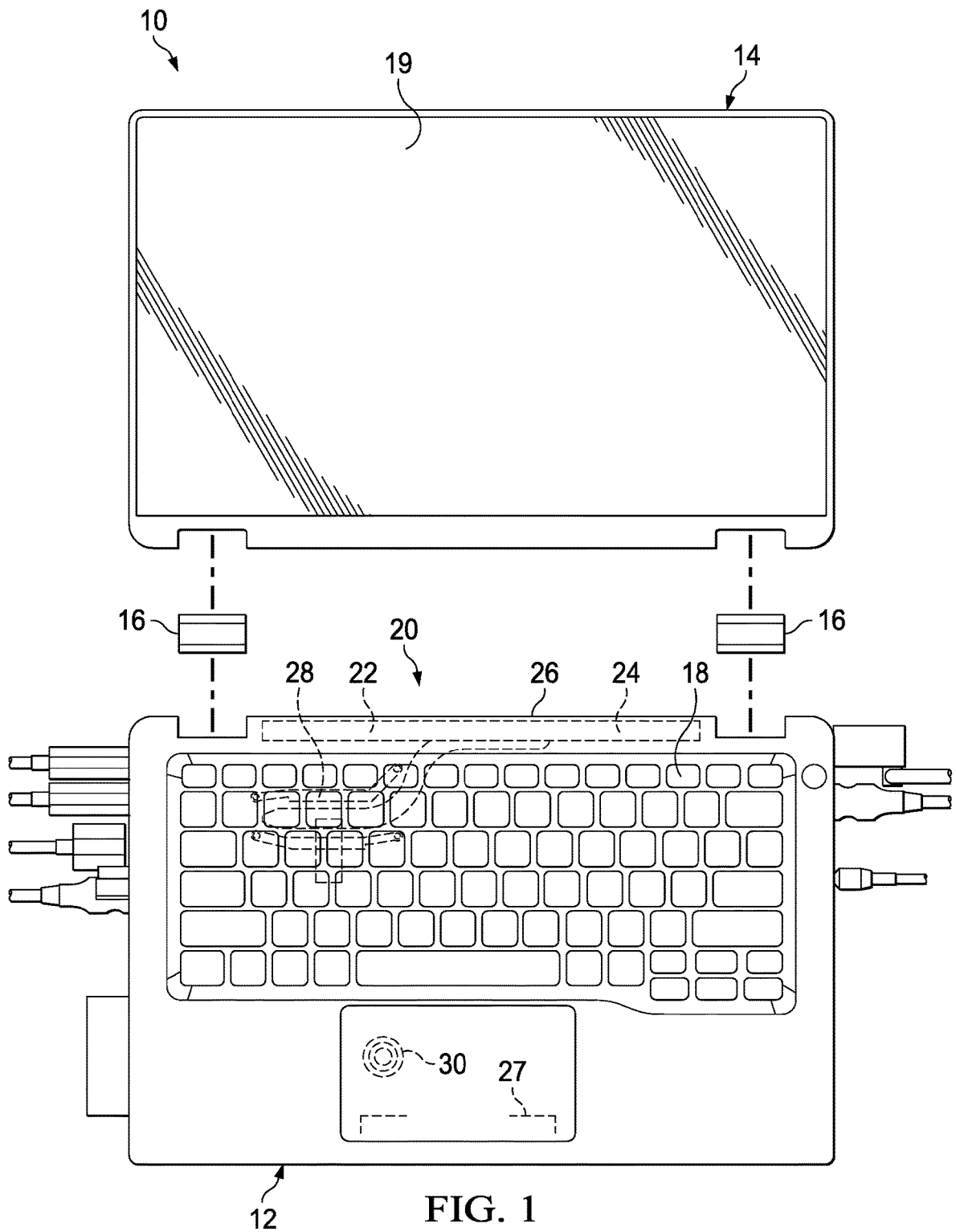
FIG. 1 depicts a top view of a portable information handling system having plural antenna disposed in a main housing portion.

Referring now to FIG. 1, a top view depicts a portable information handling system 10 having plural antenna 22 and 24 disposed in a main housing portion 12. In the example embodiment, main housing portion 12 rotationally couples to a lid housing portion 14 with a pair of hinges 16, such as dual axle hinges that provide 360 degrees of rotational movement of lid housing portion 14 relative to main housing portion 12. For instance, lid housing portion 14 rotates from a closed position having a display 19 over top of a keyboard 18 to a clamshell position of about 90 degrees of rotation in which main housing portion 12 supports display 19 in a viewing position over keyboard 18 so that an end user can type inputs while viewing display 19. As depicted, display 19 rests on a support surface opposite keyboard 18 after about 180 degrees of rotation, such as allows an end user to interact with a touchscreen of display 19 as a tablet. A full 360 degrees of rotation of lid housing portion 14 relative to main housing portion 12 disposes keyboard 18 under display 19 to support mobile tablet interactions by an end user. In the example embodiment, main housing portion 12, lid housing portion 14 and a cover that holds keyboard 18 in position have a metallic construction to provide structure support against torsional forces introduced during rotational movement. Further, display 19 integrates in lid housing portion 14 with a narrow edge construction that enhances portability and provides a clean industrial design having images presented across the length and width of the lid housing portion.

Manufacture of information handling system 10 with a minimal boundary display 19 and with a metallic housing presents difficulty for the effective disposition of antenna in information handling system 10 to support wireless communication. In the example embodiment, an antenna support 20 is coupled to main housing portion 12 between hinges 16 along the rear side of main housing portion 12 to provide wireless signal pathway in support of a pair of wireless wide area network (WWAN) antenna 22 and 24, such as to support communication with an LTE network. Placement of antenna 22 and 24 in close proximity can degrade antenna performance due to mutual coupling of the antenna during transmissions in channels, such as do to near field current effects. A parasitic element 26 is disposed between antenna 22 and 24 to further aid isolation. For instance, antenna support 20 is a printed circuit board having approximately 210 mm between hinges 16 with each antenna 22 and 24 having a length of approximately 75 mm so a minimal space of approximately 55 mm exists to place parasitic element 26. Generally, a quarter wavelength of space is desired between antenna 22 and 24 to obtain sufficient isolation for reducing mutual coupling, however that amount of space is difficult to find in main housing portion 12, especially where metallic material is desired for housing strength. In the example embodiment, wireless local area network antenna 27 and near field communication antenna 30 are also included and best operated with a clear wireless signal pathway. To obtain acceptable WWAN signal strength, further isolation of antenna 22 and 24 is desirable.

Figure 2:
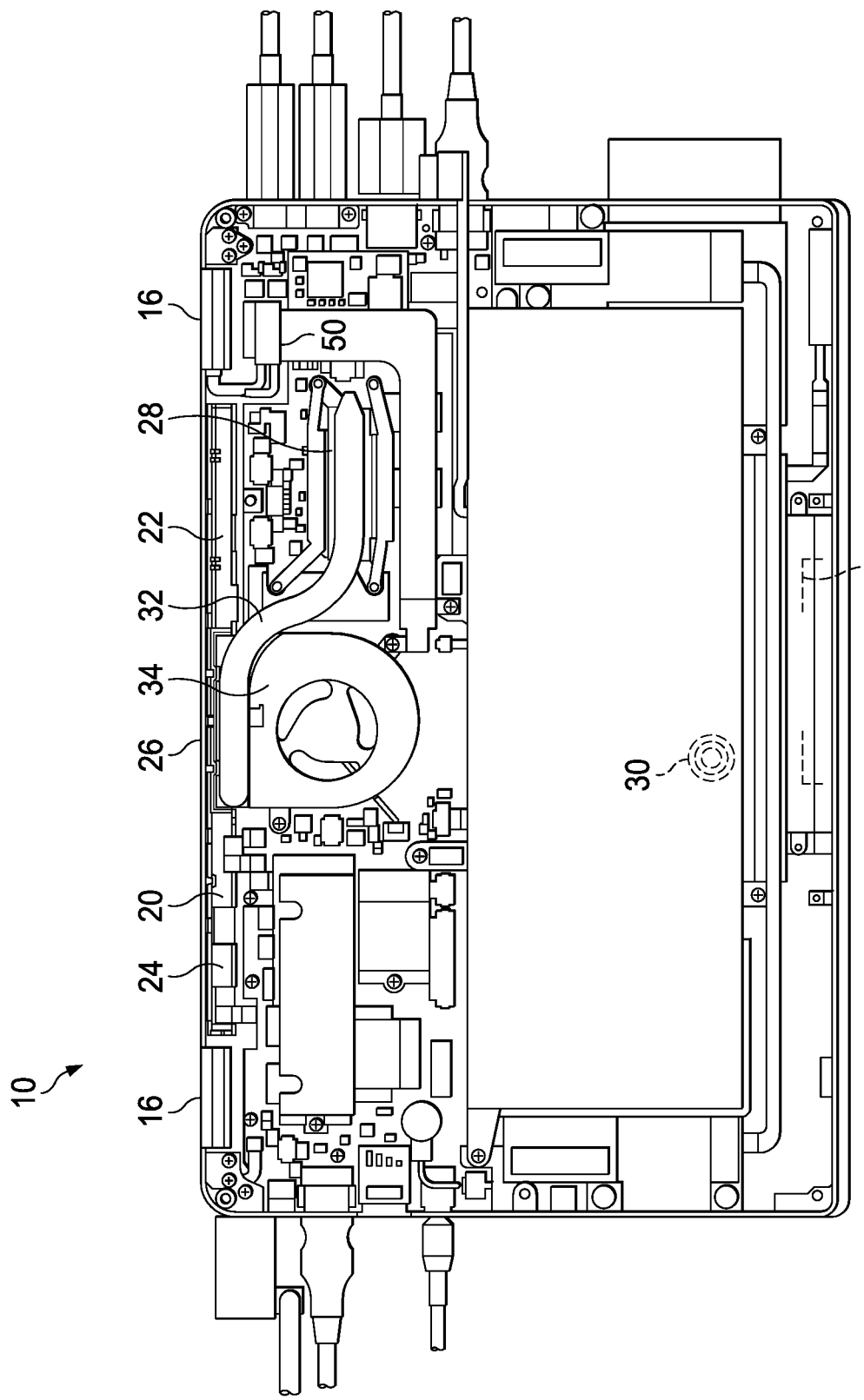
FIG. 2 depicts a bottom cutaway view of the portable information handling system having first and second antenna disposed proximate a cooling fan exhaust.

Referring now to FIG. 2, bottom cutaway view depicts portable information handling system 10 having first and second antenna 22 and 24 disposed proximate a cooling fan 34 exhaust. Information handling system 10 processes information with a central processing unit (CPU) 28 that executes instructions and a random access memory (RAM) that stores the information and instructions. To remove excess thermal energy generated by CPU 28, a heat sink and heat pipe 32 thermally couple to CPU 28 to transfer thermal energy towards a cooling fan 34. Cooling fan 34 generates a cooling airflow past heat pipe 32 to draw thermal energy out of main housing portion 12.

In the example embodiment, cooling fan 34 has a metallic or other conductive housing material and is placed to exhaust over top of parasitic element 26. In the example position depicted, cooling fan 34 is placed between antenna 22 and 24 to aid in isolation of each of antenna 22 and 24. For example, radio 50 grounded to a motherboard in main housing portion 12 communicates wireless signals to antenna 22 and 24 through a coaxial cable interface. Antenna support 20 grounds using gaskets with metal material extending from a keyboard cover described below. Cooling fan 34 couples to and grounds to the motherboard that supports radio 50, as does heat pipe 32. With the grounded metal structure of cooling fan 34 disposed between antenna 22 and 24, isolation of antenna 22 and 24 is enhanced. Further, parasitic element 26 provides isolation by, in effect, forcing surface currents related to mutual coupling to travel along the ground plane, essentially creating a longer path for current to follow and making up for the "shortfall" in spacing between antenna 22 and 24.

Figure 3:
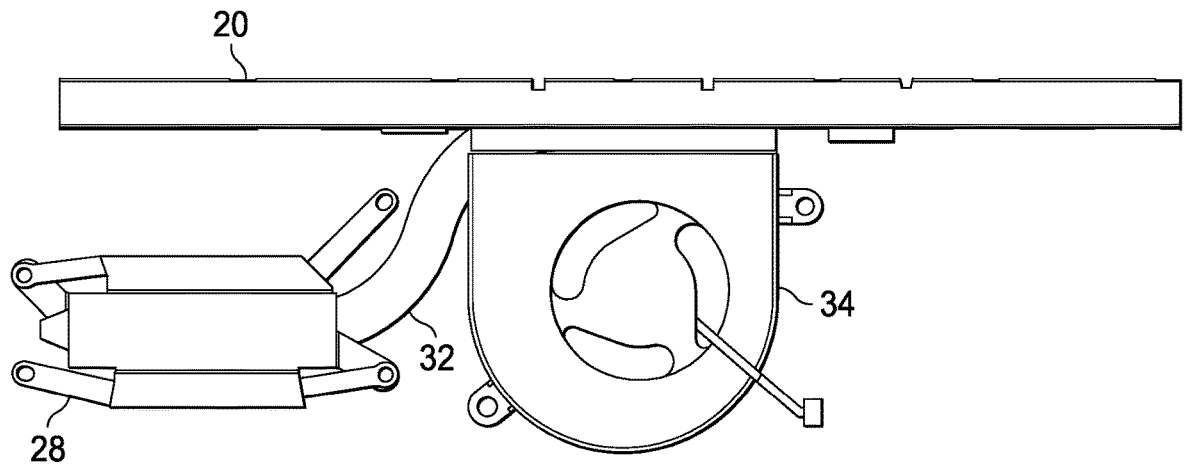
FIG. 3 depicts a top view of an antenna structure having a cooling fan extending between antenna disposed on the antenna support.
Figure 4:
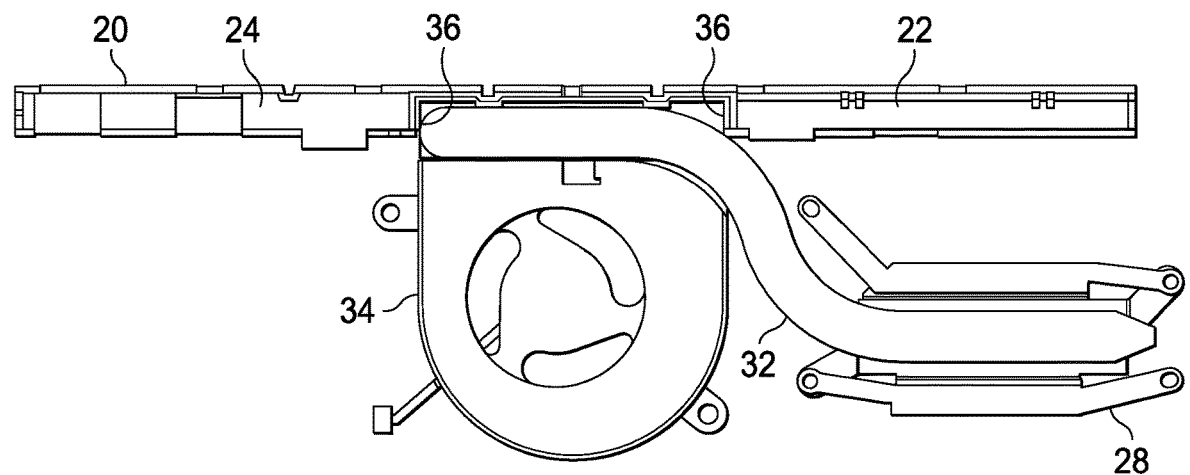
FIG. 4 depicts a bottom view of an antenna structure having a cooling fan disposed on the antenna support.

Referring now to FIG. 3, a top view depicts an antenna support 20 having a cooling fan 34 extending between antenna 22 and 24 disposed on the antenna support 20. Antenna support 20 has a side wall extending downward that defines an exhaust through which cooling fan 34 expels heated airflow. For the upper view of FIG. 3, antenna support 20 is placed over cooling fan 34. Referring now to FIG. 4, a bottom view depicts antenna support 20 having cooling fan 34 disposed on the antenna support. Antenna 22 and 24 are formed on perpendicular sides of antenna support 20 with cooling fan 34 abutted against the back side of antenna support 20. Placement of cooling fan 34 in between antenna 22 and 24 creates a metal structure inserted between the antenna that acts as an isolator, shield and grounding mechanism that aid antenna performance. The intersection 36 of cooling fan 34 and antenna support 20 defines antenna isolation between antenna 22 and 24 that are formed on opposing ends of antenna support 20.

Figure 5:
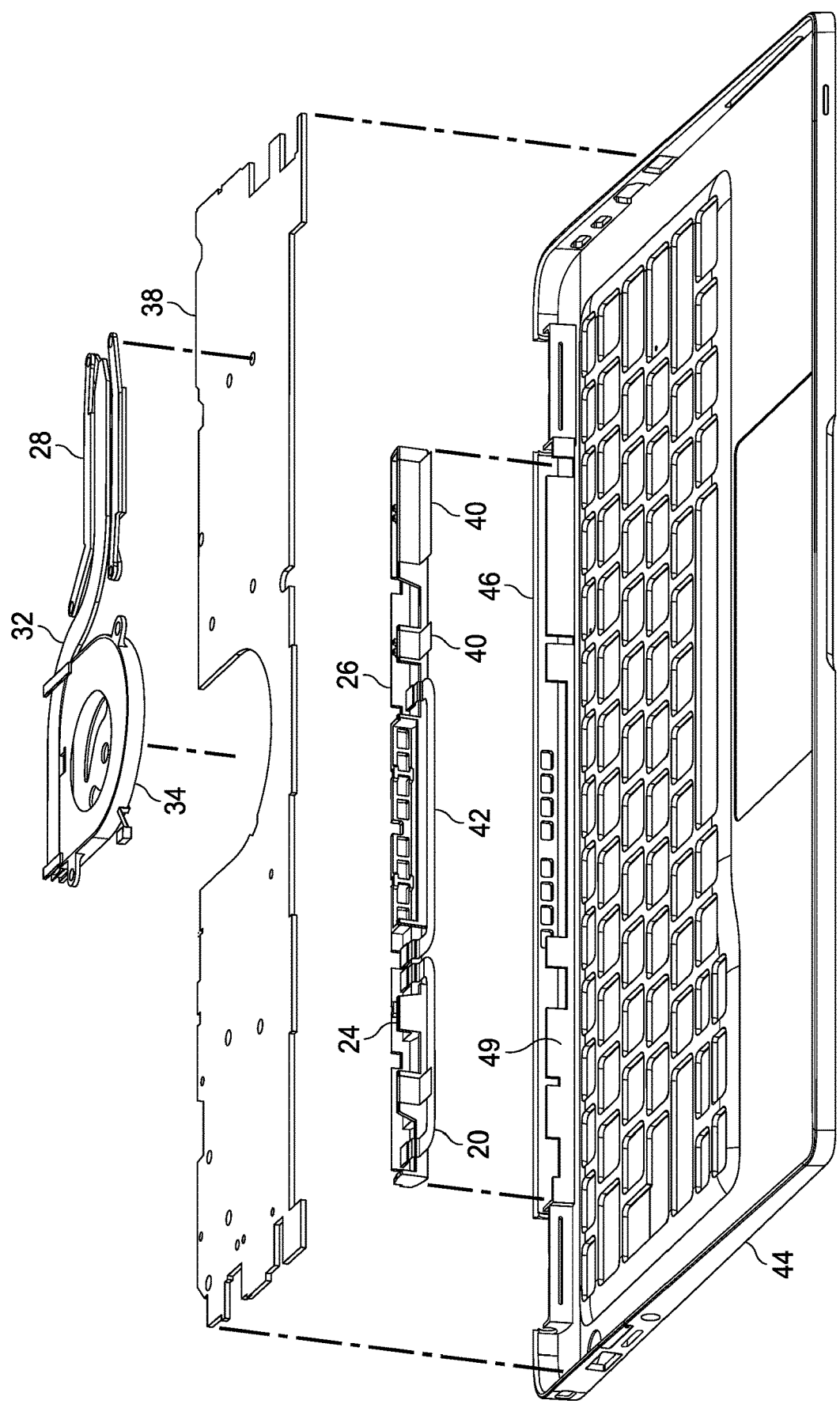
FIG. 5 depicts a bottom exploded view of the antenna structure integrated in a keyboard cover.

Referring now to FIG. 5, a bottom exploded view depicts antenna support 20 integrated in a keyboard cover 44. In the example embodiment, cooling fan 34 is sized to fit in an opening formed in motherboard 38 that aligns cooling fan 34 between antenna 22 and 24. The opening in motherboard 38 allows freedom along the Z-axis or height of information handling system 10 to adjust placement of cooling fan 34 in a manner relative to antenna 22 and 24 that optimizes radiofrequency isolation, thus improving antenna performance. Heat pipe 32 is formed as necessary to fit over CPU 28 and communicate thermal energy from CPU 28 to the exhaust of cooling fan 34. In the example embodiment, antenna support 20 defines antenna 22 and 24 on a flexible printed circuit board folded into perpendicular sections and held in position by a plastic molded support 42 and interfaced through a cable connection 40. Support 42 couples to a radiofrequency window 46 integrated in a keyboard cover 44, such as with snaps or other coupling mechanisms. For example, radiofrequency window 46 has a hardened thermoplastic material that also forms an exhaust vent 48 for exhaust of cooling fan 34. Keyboard cover 44 is a metallic material, such as aluminum, that provides increased structural strength to help resist torsional forces introduced at a low Z-height housing during rotational movement. Metallic members 49 extend downward from keyboard cover 44 proximate window 46 to help further isolate antenna 22 and 24. For example, antenna support 20 is grounded to members 49 with gaskets so that members 49, cover 44, cooling fan 34, heat pipe 32 and motherboard 38 all share a common ground. In addition, members 49 aid in capture and retention of antenna support 20.

Figure 6:
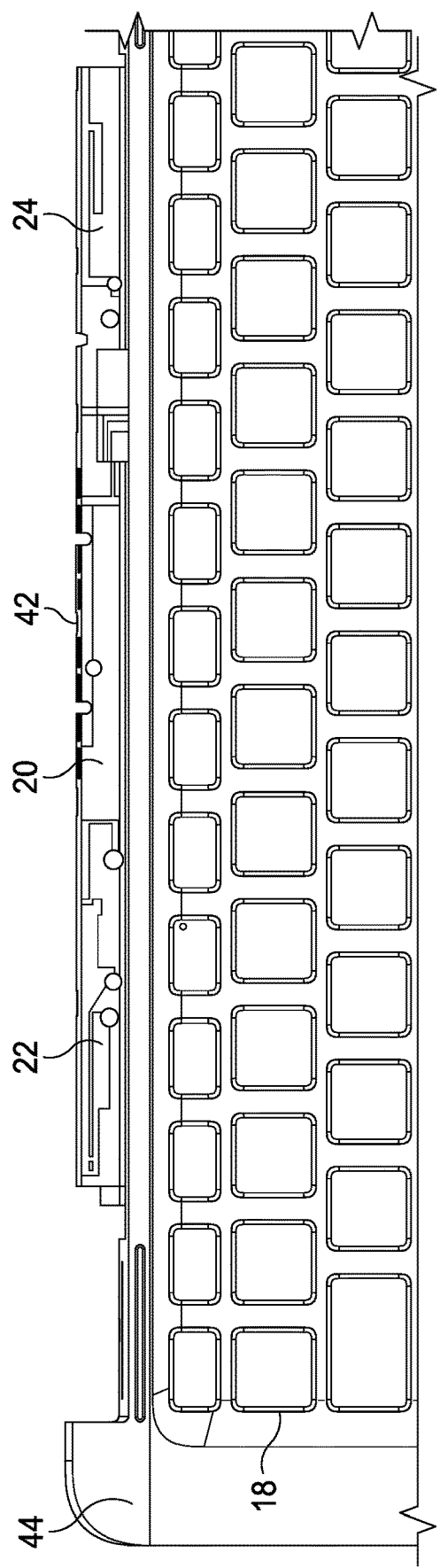
FIG. 6 depicts a top view of the antenna structure extending out from the keyboard and having the non-metallic cover removed.
Figure 7:
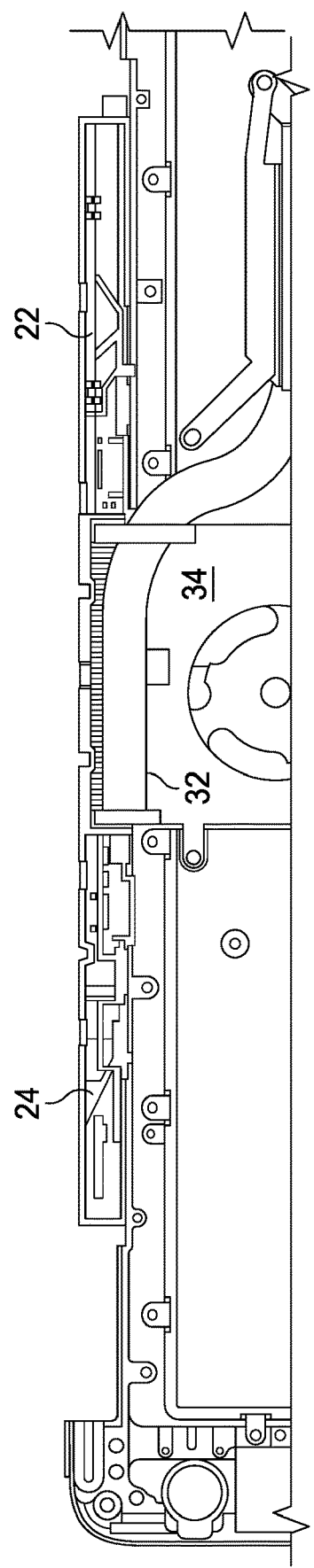
FIG. 7 depicts a bottom view of the antenna structure extending out from the keyboard and having the non-metallic cover removed.
Figure 8:
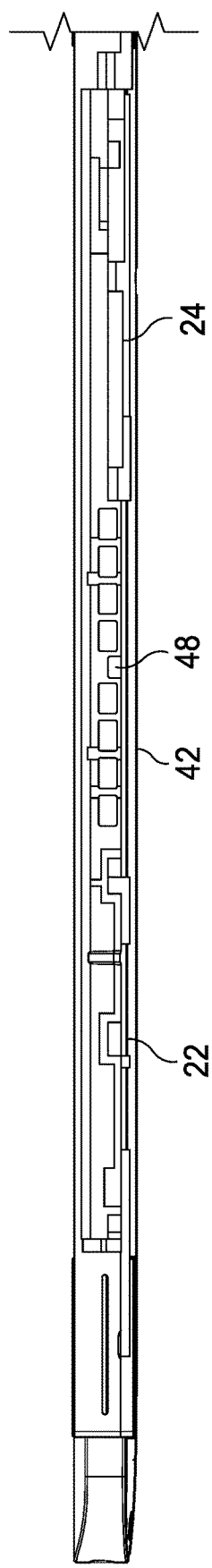
FIG. 8 depicts a side view of the antenna structure having the non-metallic cover removed.

Referring now to FIG. 6, top view depicts the antenna support 20 extending out from the keyboard and having the radiofrequency window 46 removed. Keyboard 18 extends through key openings formed in cover 44 to accept key inputs from an end user. Antenna support 20 extends outward from cover 44 to provide a clear radiofrequency pathway for transmission of wireless signals. As explained above, cooling fan 34 fits under parasitic element 26 midway between antenna 22 and 24. Referring now to FIG. 7, a bottom view depicts antenna support 20 extending out from the keyboard 18 and having the radiofrequency window 46 removed. From the bottom view, placement of cooling fan 34 over parasitic element 26 and between antenna 22 and 24 is illustrated. Referring now to FIG. 8 a side view depicts antenna support 20 having the radiofrequency window 46 removed. Cooling fan exhaust 48 formed in the plastic molded support 42 of antenna support 20 provides openings through which cooling fan 34 exhausts heated air.

Figure 9:
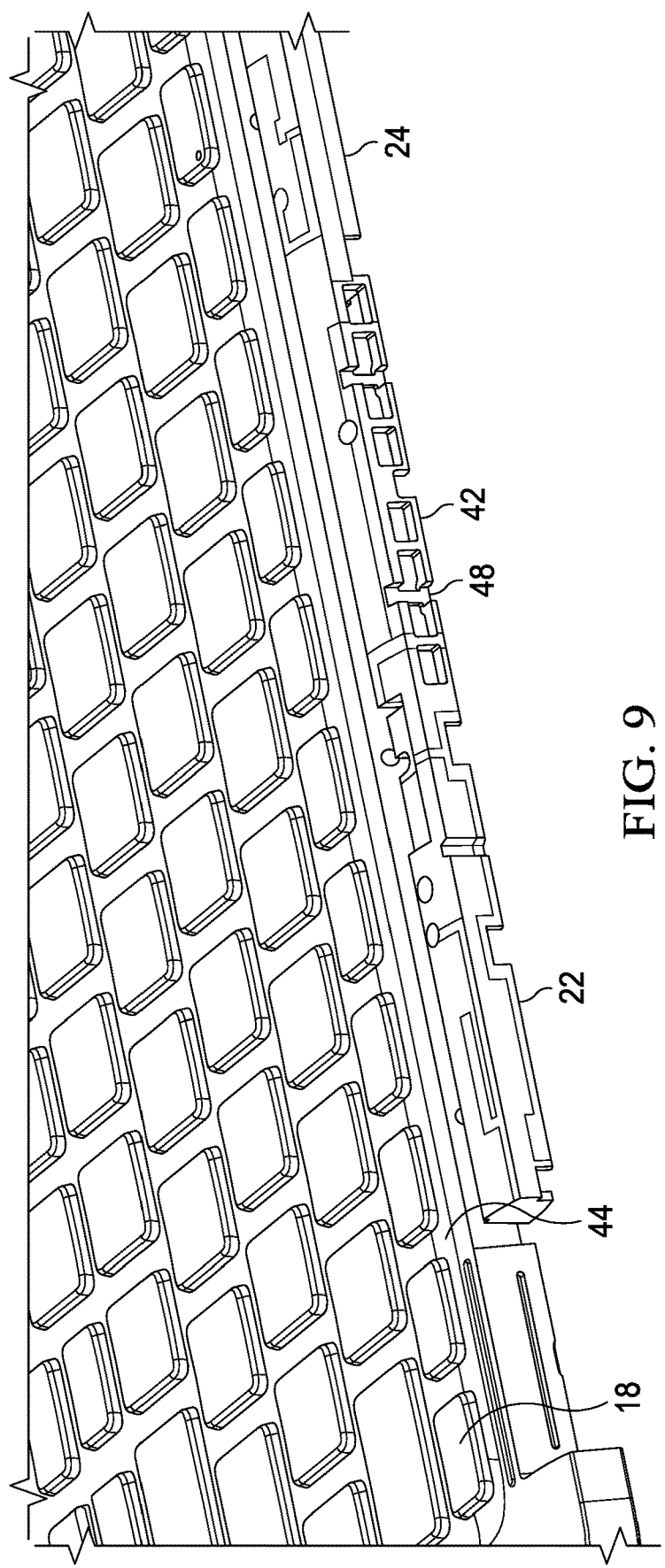
FIG. 9 depicts an upper perspective view of the antenna structure having the non-metallic cover removed.

Referring now to FIG. 9 an upper perspective view depicts the antenna support 20 having the radiofrequency window 46 removed. In the example embodiment, antenna 22 supports auxiliary LTE communications and antenna 24 supports main LTE communications. Each of antenna 22 and 24 are printed circuits defined in a flexible printed circuit board and folded over a non-conductive plastic molded support base 42 to extend outward from keyboard 18 and cover 44. Parasitic element 26 is disposed between antenna 22 and antenna 24 and tuned to reduce mutual coupling, such as can be caused by surface currents extending between antenna 22 and antenna 24. As illustrated by FIG. 9, parasitic element 26 may include conductive elements that extend downward between cooling fan 34 exhaust 48 openings. In various embodiments, antenna and parasitic element printed circuits may have various forms as desired to transmit desired wireless signals, such as WLAN signals, and with various antenna configurations, such as MIMO antenna configurations. Antenna tuning will depend upon the desired wireless transmission signal frequencies, the space between hinges of the housing that is available for the antenna structure, and the relationship between system ground and the antenna where ground may include cooling fan 34 and heat pipe 32.

Figure 10:
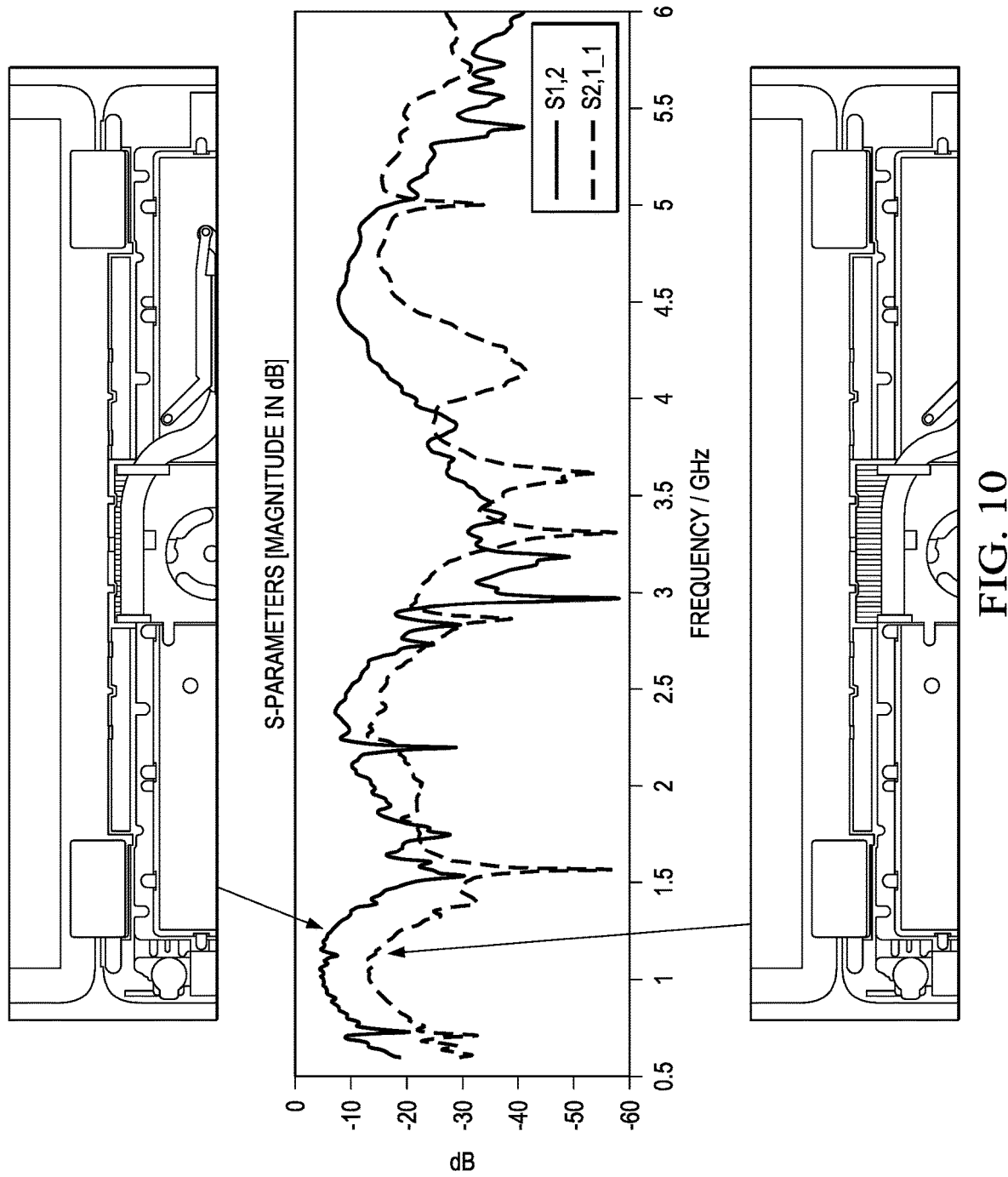
FIG. 10 depicts a graph illustrating isolation performance of the antenna structure with the cooling fan over the antenna structure and withdrawn from a position over the antenna structure.

Referring now to FIG. 10 a graph illustrates isolation performance of the antenna support 20 with cooling fan 34 over antenna support 20 and withdrawn from a position over the antenna support. The example graph includes S-parameters in dB for antenna interference with cooling fan 34 pushed into position between antenna 22 and 24, and for cooling fan 34 pushed backwards away from antenna 22 and 24. Although antenna performance varies along the radiofrequency spectrum and targets desired transmission bands, generally an improvement of 20 dB in antenna efficiency is provided by improved isolation resulting from placement of cooling fan 34 between antenna 22 and 24. The improved performance is generally provided in a restricted space by disruption of mutual coupling with the shared ground structures, however, as frequency shifts between different bands, resonance of the mutual coupling shifts so that tuning of the ground response can further adjust antenna performance.

Figure 11:
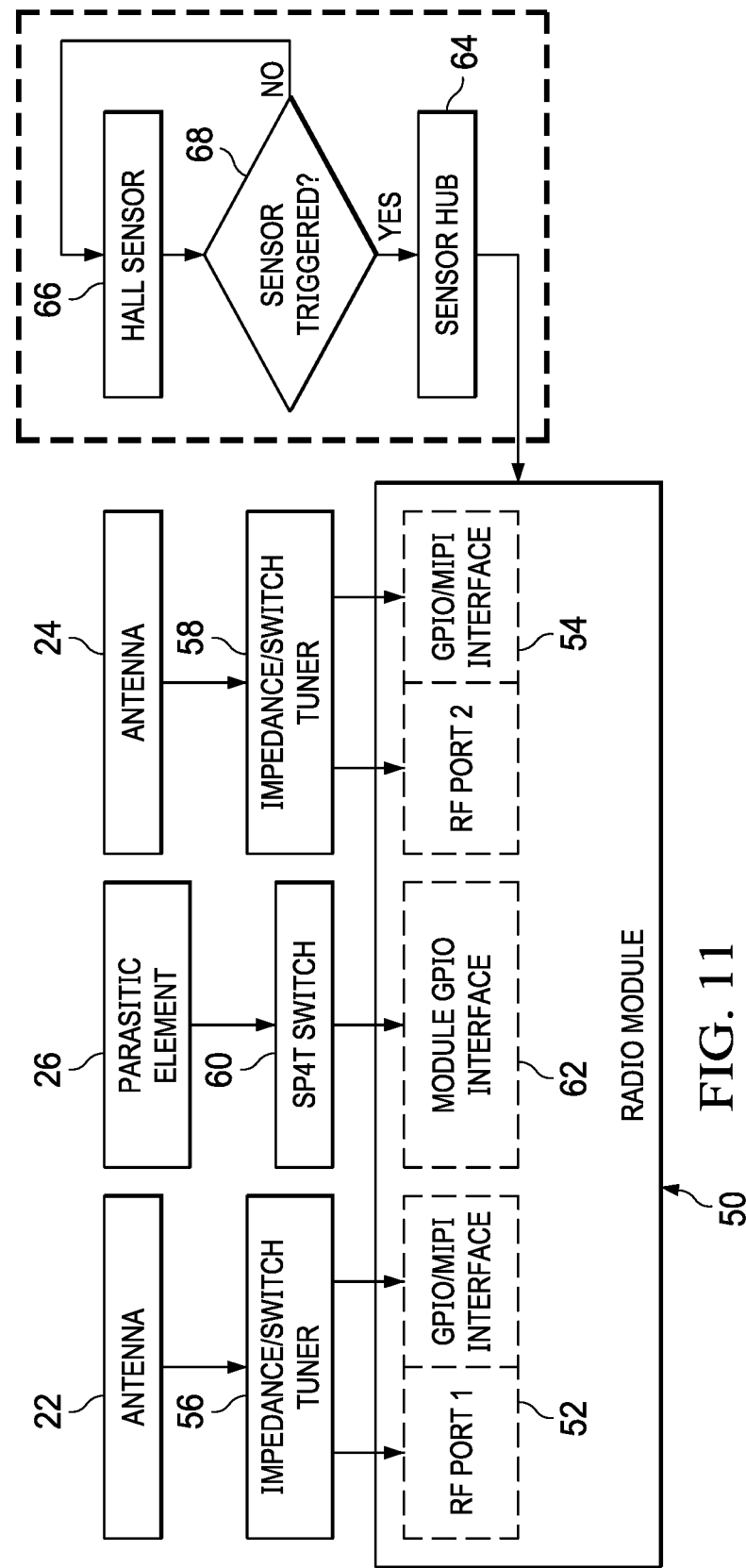
FIG. 11 depicts a circuit block diagram of a radio module that adopts parasitic element resonance based upon antenna frequency.

Referring now to FIG. 11, a circuit block diagram depicts a radio module 50 that adopts parasitic element 26 resonance based upon antenna frequency. In the example embodiment, radio module 50 is an integrated circuit having GPIO and/MIPI interfaces to control antenna and parasitic element resonance. Radio module 50 communicates wireless signals to antenna 22 and 24 through RF ports 52 and 54 and an impedance switch and tuner 56 and 58 disposed between each antenna 22 and 24. In the example embodiment, radio module 50 tunes antenna 22 and antenna 24 to support four different LTE frequency bands: B12 (698-746 MHz); B29/28/13/14 (717-798 MHz); B26/19/18/5/6/20 (814-894 MHz); and B8 (880-960 MHz). For example, impedance switch and tuner 56 and 58 selects LC circuit values to match antenna 22 and 24 impedance to the frequency of radio module 50. Radiofrequency tuning may also depend upon detection of bodies proximate to antenna 22 and antenna 24, such as may introduce near field effects that interfere with antenna impedance tuning. For example, a Hall sensor 66 is monitored by sensor logic 68 to trigger a sensor hub 64, such as when a tablet mode rotates the housing portions in proximity to each other. Radio module 50 may select impedance tuning settings for antenna 22 and 24 based upon a trigger from such a proximity detection.

As an example, of impedance tuning based upon inputs by a Hall sensor 66, radio module 50 stores antenna impedance tuning states for each of plural housing configurations and applies the stored antenna impedance tuning states based upon Hall sensor output. For instance, in a clamshell mode Hall sensor 66 detects the rotational orientation of lid housing portion 14 rotated 90 degrees relative to main housing portion 12. In response to detection of clamshell mode, radio module 50 looks up impedance values for the selected LTE band at a clamshell rotational orientation and applies the impedance values to adjust the impedance of antenna 22 and 24 and parasitic element 26. The impedance values reflect an expected impact on radiofrequency characteristics for the relative position of lid housing portion 14 to antenna support 20, such as near field effects created by the metal material of lid housing portion 14. In various embodiments, stored impedance values to apply to antenna 22 and 24 and to parasitic element 26 may be kept for a variety of orientations of lid housing portion 14 relative to main housing portion 12 as desired based upon experiment antenna performance. Further adjustment of antenna impedance may be performed by measuring capacitive effects associated with the proximity of lid housing portion 14 to antenna support 20, such as by monitoring capacitance to detect object proximity, such as to maintain SAR constraints as set forth in U.S. patent application Ser. No. 16/221,046, filed Dec. 14, 2018, by Ching Wei Chang, entitled "Information Handling System Radio Transmit Power Management" and filed concurrently with the present application, which is incorporated herein as if fully set forth.

In addition to tuning antenna 22 and 24, a GPIO interface 62 of radio module 50 interfaces through an SP4T switch 60 or similar selection structure to tune parasitic element 26. For example, SP4T switch 60 has a setting for each of the four LTE frequency band groups described above. The isolation performance of parasitic element 26 varies based upon the ground structure interfaced with it. For instance, the size of the conductive housing of cooling fan 34 and the length of heat pipe 32 will each impact the isolation of mutual coupling between antenna 22 and 24 provided by parasitic element 26. Thus, in various embodiments, logic in radio module 50 considers the frequency at which antenna 22 and 24 communicate, the size and length of ground structures interfaced with antenna structure 20, and the detection of proximate object when setting resonance of parasitic element 26.

Figure 12:
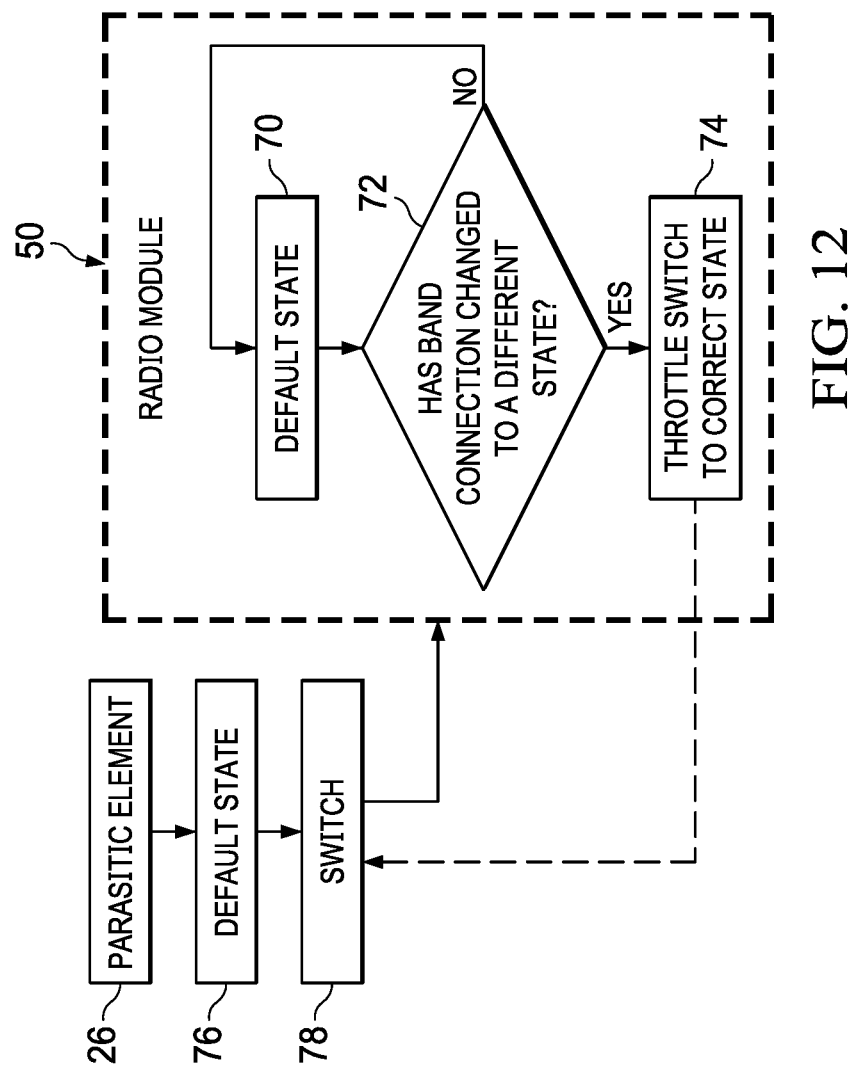
FIG. 12 depicts a flow diagram of a process for adopting parasitic element resonance based upon antenna frequency.

Referring now to FIG. 12, a flow diagram depicts a process for adopting parasitic element resonance based upon antenna frequency. At step 70, a default state 76 is initially set through switch 78 for a default antenna tuning frequency. At step 72 a determination is made of whether the LTE band has changed for the wireless communication to a different state, such as one of the groups of frequency bands describe above. If not, the process returns to step 70 to continue monitoring the radio's communication band. If a change in communication band is detected at step 72, the process continues to step 74 to command switch 78 to tune parasitic element 26 to adjust mutual coupling isolation based upon the tuning of antenna 22 and antenna 24. In alternative embodiments, isolation tuning may involve multiple interactions across different frequency bands. For instance, the four states described in the above example cover 700 MHz to approximately 960 MHz, the low band of LTE; however, in alternative embodiments, a wider band of coverage may be provided with additional switch configurations as needed to support desired wireless protocols.

Although the present invention has been described in detail, it should be understood that various changes, substitutions and alterations can be made hereto without departing from the spirit and scope of the invention as defined by the appended claims.

What is claimed is:

1. A method for communicating wireless signals at a portable information handling system, the method comprising:

coupling a first antenna and a second antenna along one side of the portable information handling system housing;

coupling a cooling fan to exhaust air at the one side of the portable information handling system housing between the first antenna and the second antenna;

communicating wireless signals from the first antenna and the second antenna; and isolating wireless signal interference between the first antenna and the second antenna with a grounded metallic material of the cooling fan disposed between the first antenna and the second antenna.

2. The method of claim 1 wherein the coupling the first antenna and the second antenna further comprises:

coupling the first antenna and the second antenna to an antenna support separate from a motherboard of the portable information handling system; and extending the cooling fan from the motherboard across the antenna support between the first antenna and the second antenna.

3. The method of claim 2 wherein the coupling a cooling fan further comprises:

forming an opening in the motherboard extending from the one side of the information handling system towards an opposing side of the information handling system, the opening configured to fit the cooling fan;

coupling the cooling fan in the opening.

4. The method of claim 2 further comprising:

disposing a parasitic element on the antenna support between the first antenna and the second antenna and below the cooling fan; and tuning the parasitic element to isolate the first antenna and the second antenna.

5. The method of claim 2 further comprising:

coupling a heat pipe at a first end to the cooling fan and at a second end to a processor coupled to the motherboard; and tuning the parasitic element to isolate the first antenna and the second antenna based in part upon a length of the heat pipe.

6. The method of claim 2 further comprising:

coupling a metal keyboard cover over the cooling fan, the metal keyboard cover having a nonmetallic portion; and aligning the nonmetallic portion over the first antenna and the second antenna.

7. The method of claim 6 further comprising extending a first metallic member and a second metallic member downward from the keyboard cover towards the motherboard, the first metallic member aligned with the first antenna, the second metallic member aligned with the second antenna.

* * * * *